(12) United States Patent
Pfeiffer et al.

(10) Patent No.: US 8,597,048 B2
(45) Date of Patent: Dec. 3, 2013

(54) MULTILEVEL CONNECTOR SYSTEM

(75) Inventors: Ulrich Pfeiffer, Munich (DE); Tobias Thomamuller, Bruckmuhl (DE); Reinhold Knoll, Munich (DE)

(73) Assignee: Edwards Lifesciences IPRM AG, Nyon (CH)

( * ) Notice: Subject to any disclaimer, the term of this patent is extended or adjusted under 35 U.S.C. 154(b) by 692 days.

(21) Appl. No.: 12/599,473

(22) PCT Filed: May 5, 2008

(86) PCT No.: PCT/EP2008/003625
§ 371 (c)(1),
(2), (4) Date: Oct. 12, 2010

(87) PCT Pub. No.: WO2008/138515
PCT Pub. Date: Nov. 20, 2008

(65) Prior Publication Data
US 2011/0199095 A1    Aug. 18, 2011

(30) Foreign Application Priority Data
May 11, 2007  (DE) .......... 10 2007 022 210

(51) Int. Cl.
*H01R 3/00*    (2006.01)
(52) U.S. Cl.
USPC ....................................... 439/489
(58) Field of Classification Search
USPC .......... 439/489, 188, 955, 505, 630, 637, 507
See application file for complete search history.

(56) References Cited

U.S. PATENT DOCUMENTS

| | | | |
|---|---|---|---|
| 4,949,035 A | 8/1990 | Palmer | |
| 5,174,787 A | 12/1992 | Shirai et al. | |
| 5,203,004 A | * 4/1993 | Bunton et al. | 713/340 |

(Continued)

FOREIGN PATENT DOCUMENTS

| | | |
|---|---|---|
| EP | 0602804 | 6/1994 |
| EP | 0689854 | 1/1996 |
| GB | 2218277 | 11/1989 |

OTHER PUBLICATIONS

Card Insert/Remove Detection Using Two Phase Card Pins, IBM Technical Disclosure Bulletin, IBM Corp., New York, US, vol. 36, No. 3, Mar. 1, 1993, pp. 199-200, XP000354748.

(Continued)

*Primary Examiner* — Xuong Chung Trans
(74) *Attorney, Agent, or Firm* — Michael Crapenhoft

(57) ABSTRACT

The invention relates to a connector system comprising a first connector having a plurality of first contact terminals (E, F, G, J); a second connector having a plurality of second contact terminals, wherein the second contact terminals (A, B, C, D) and the electrical device are arranged such that, while connecting, the first contact terminals come into contact with a first subset of the plurality of second contact terminals in a first connecting stage and while the connecting further proceeds the first contact terminals come into contact with a second subset of the second contact terminals, such that in the first connecting stage an electrical quantity between two of the first contact terminals is detectable which is different from the electrical quantity in an uncoupled condition of the connectors, and in the second connecting stage a further electrical quantity between at least two of the first contact terminals is detectable which is different from the electrical quantity detected in the first connecting stage.

6 Claims, 5 Drawing Sheets

(56) References Cited

U.S. PATENT DOCUMENTS 5,521,586 A    5/1996  Takeshita
5,836,785 A *  11/1998 Lee ............................ 439/505
5,945,662 A *  8/1999  Vallat ......................... 235/492
6,411,053 B1 * 6/2002  Dewey ........................ 318/445
7,044,770 B2 * 5/2006  MacLaren et al. ......... 439/489

2003/0146764 A1   8/2003  Lee

OTHER PUBLICATIONS

International Search Report, Jul. 21, 2008.
Chinese Office Action, Apr. 16, 2012.
European Office Action, Jul. 25, 2012.

* cited by examiner

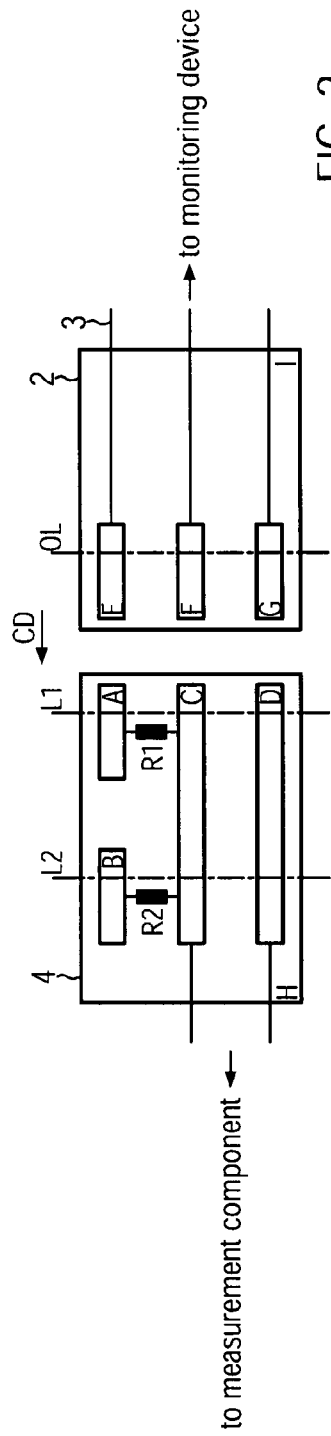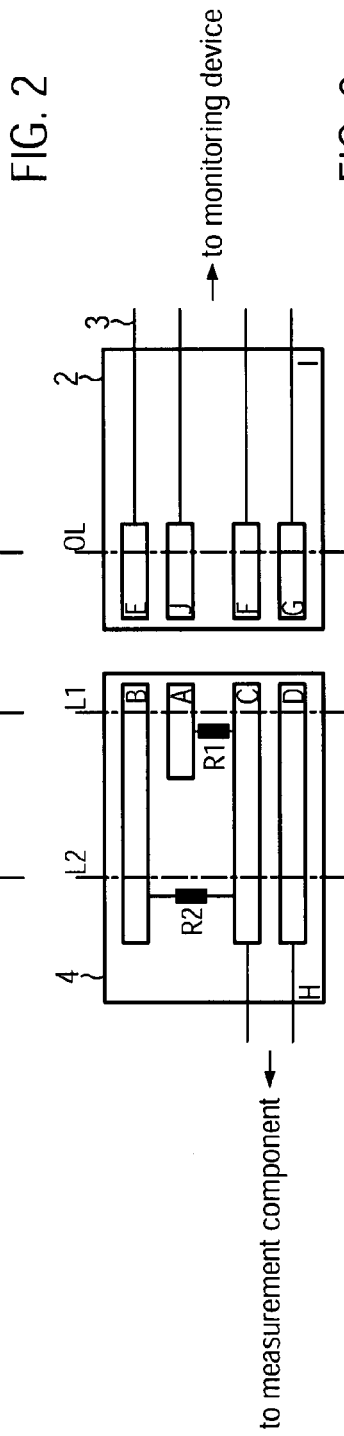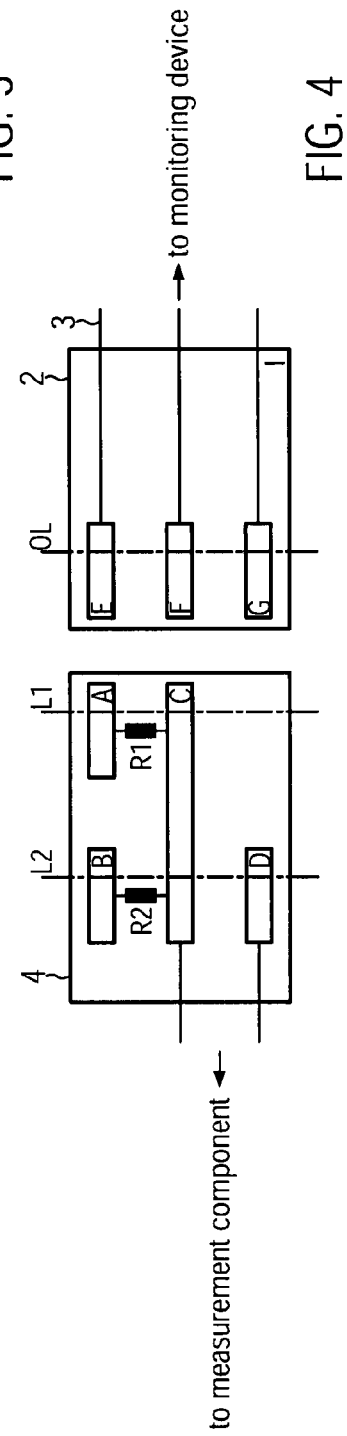

MULTILEVEL CONNECTOR SYSTEM

The present invention is related to the field of connectors for appliances, in particular for medical use.

In medical monitoring systems one or more electronic components, such as a measurement equipment, actuator equipment and the like, are connected with a base station, such as a monitoring device, a control unit and the like, to provide a specific functionality. In practice, it is often the case that measurement equipment such as a sensor and the like is connected to a monitoring device or another measurement unit which use the measurement equipment to obtain measurement values to be monitored in the monitoring device. Usually, such a monitoring device is operable with a plurality of different sensors or other devices. Further, it might be possible that any measurement equipment can be connected to the monitoring device which might be not configured to be operated therewith. Therefore, there is a need that the monitoring device gets an indication about whether a correct measurement equipment is connected and furthermore what kind of measurement equipment is connected. Thereby, measurement failures resulting in wrong interpretation of measurement results, electrical shortcuts and damage of the electrical equipment could be avoided.

Since the measurement equipment often comprises disposable components and due to its small size it is not appropriate to equip the disposable measurement sensor with any processor or similar expensive electronic parts which allow a unique identification of the measurement equipment in the monitoring device. Furthermore, there is a need that the measurement equipment is kept as small as possible.

A conventional solution to assure that the monitoring device is connected to a correct measurement device is to realize a specific geometry of a plug which only fits to a corresponding socket and vice versa. Other measurement components then provide other shapes of plugs thereby being incapable to be connected with the monitoring device. Another known approach is to arrange pins of the plug in a specific arrangement such that the pins of the plug and the respective contact terminals of the socket have to be in correspondence to enable a correct coupling.

Moreover, in case that different kinds of measurement components are to be connected with one monitoring device depending on the intended use the connector geometry associated with the monitoring device has to be adapted to match with different kinds of connectors associated with the respective measurement component. There still remains the issue that the monitoring device should be informed about which kind of measurement component has been connected.

It is therefore an object of the present invention to provide a connector system for connecting an electrical component to a base station wherein the connector system provides a protection against erroneous connecting of an incorrect electrical component which is not appropriate to operate with the base station. It is a further object of the present invention to provide that the connector system avoids the implementing of expensive electronic parts or any processing device within the electrical component in particular in case the electrical component is disposable which is often the case in medical appliances. Furthermore, it is object of the present invention that in case that different components are capable to function with the base station the electrical component connected can be identified during the connecting process without modifying the electrical component to be connected or to manually input respective data in the base station.

These objects are achieved by the connector system according to claim 1, an electrical component arrangement, a monitoring device and a method for operating an electrical component according to the further independent claims.

Further embodiments of the present invention are defined in the depending subclaims.

According to a first aspect a connector system is provided. The connector system comprises a first connector for coupling a monitoring device and having a plurality of first contact terminals, and a second connector for coupling an electrical component and having a plurality of second contact terminals. Between at least two of the plurality of second contact terminals an electrical device is arranged for providing a detectable electrical quantity. The first and second connectors are capable of being coupled in a connecting process. The second contact terminals and the electrical device are arranged such that, while connecting, the first contact terminals come into contact with a first subset of the plurality of second contact terminals in a first connecting stage and while the connecting further proceeds the first contact terminals come into contact with a second subset of the second contact terminals, such that in the first connecting stage an electrical quantity between two of the first contact terminals is detectable which is different from the electrical quantity in an uncoupled condition of the connectors, and in the second connecting stage a further electrical quantity between two of the first contact terminals is detectable which is different from the electrical quantity detected in the first connecting stage.

Furthermore, the electrical device may be at least one of a resistor, a capacity and an inductivity.

According to an embodiment, the second connector may be configured to provide two second contact terminals wherein one of the two second contact terminals being contactable by a respective one of the first contact terminals in the first connecting stage and the other of the two second contact terminals is contactable by the respective one first contact terminal in the second connecting stage.

The two second contact terminals may be each coupled with one electrical device and are spaced such that, while connecting, the one first contact terminal is isolated from the two second contact terminals between the first and the second connecting stages.

According to a further aspect an electrical component arrangement is provided comprising an electrical component and a connector coupled with the electrical component. The connector having a plurality of contact terminals, wherein between at least two of the plurality of contact terminals an electrical device is arranged for providing a detectable electrical quantity. A first subset of the plurality of contact terminals is arranged to be contactable in a first connecting stage and a second subset of the contact terminals is arranged to be contactable in a second connecting stage, such that, when contacting the first subset of the contact terminals in the first connecting plane an electrical quantity between two of the contact terminals is detectable, and when contacting the second subset of the contact terminals in the second connecting stage a further electrical quantity between two of the contact terminals is detectable which is different from the electrical quantity detected between the respective two of the contact terminals in the first connecting plane.

According to an embodiment one of the electrical quantities detectable in the first connecting plane and/or the second connecting plane is provided by the electrical component.

According to a further aspect a monitoring device for coupling to an electrical component by means of a connector is provided. The monitoring device comprises an identification unit for sensing timely characteristics of electrical quantities on signal lines coupled to the connector, a comparing unit for comparing the sensed timely characteristics of the electrical quantities with a prestored electrical quantity profile, and a monitoring unit for operating the electrical component via the connector depending on the result of the comparing of the comparing unit.

According to a further aspect a method for operating an electrical component via a connector is provided, comprising the steps of sensing timely characteristics of an electrical quantity on signal lines coupled to the connector, of comparing the sensed timely characteristics of the electrical quantity with a prestored electrical quantity profile, and of operating the electrical component via the connector depending on the result of the step of comparing.

Preferred embodiments of the present invention are explained in detail in conjunction with the accompanying drawings in which:

FIG. 2 is a schematic view of an arrangement of contact terminals in a first and a second connector of the connector system according to the present invention;

FIG. 3 is a schematic view of an arrangement of contact terminals of first and second connectors of a connector system according to a further embodiment of the present invention;

FIG. 4 is a schematic view of an arrangement of contact terminals of first and second connectors of a connector system according to a further embodiment of the present invention;

Like reference numbers indicate elements having a same or a similar functionality.

Figure 1:
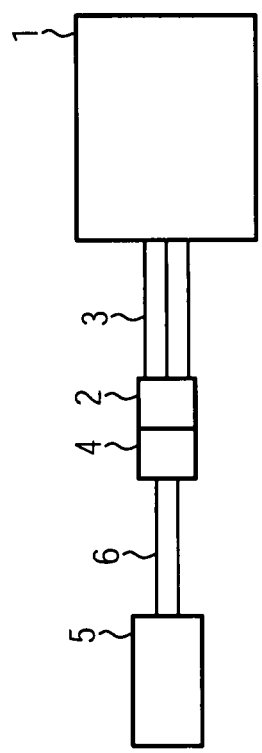
FIG. 1 is a general schematic view of a monitoring system according to a first embodiment of the present invention.

FIG. 1 shows a schematic view of a medical monitoring system in which the connector system of the present invention can be applied. The monitoring system comprises a monitoring device 1 provided with a first connector 2 which is electrically connected to the monitoring device 1 by means of electrical signal and/or supply lines 3. The monitoring device 1 can transmit and receive electrical signals via the lines 3 to and from the first connector 2. Furthermore, the monitoring device 1 can apply a supply voltage via the lines 3.

The first connector 2 can be releasably attached to a second connector 4 which is in electrical connection with a measurement component 5 such as a sensor, in particular a temperature sensor for detecting a temperature. Preferably, as the monitoring system is used in a medical environment the measurement component 5 might be a temperature sensor for sensing the body temperature of a patient which is to be monitored by the monitoring device 1. Instead of the temperature sensor other kinds of sensors, such as a pressure sensor and the like are applicable, too.

When the first connector 2 and the second connector 4 are coupled it is provided an electrical interconnection between the measurement component 5 and the monitoring device 1 in an appropriate manner, i.e. in a manner that allows the monitoring device 1 to operate the respective measurement component 5 e.g. by measuring a quantity to be measured.

More detailed views of embodiments of the connector system comprising the first and the second connectors 2, 4 are shown in FIGS. 2 to 9.

In FIG. 2 the first and the second connector 2, 4 are provided with contact terminals A to G. In detail, the first connector 2 comprises first contact terminals E, F, G which are depicted for simplicity substantially adjacent to one another and are operable to provide contact on a plane 0L indicated by a dashed line crossing the first contact terminals E, F, G in FIG. 2. The first contact terminals E, F, G are electrically connected with the monitoring device 1 via the electrical signal and/or supply lines 3.

The second connector 4 comprises second contact terminals A, B, C, D. The second contact terminals A, B, C, D are provided in a different configuration. As indicated by the connecting direction indicated by the arrow CD, the first connector 2 is moved relative to the second connector 4 to couple the connectors 2, 4 by bringing corresponding ones of the first and second contact terminals into contact. Thereby, the first contact terminal E comes in contact with the second contact terminal A, the first contact terminal F comes in contact with the second contact terminal C and the first contact terminal G comes in contact with the second contact terminal D. In other words the second contact terminals A, C, D of the second connector 4 are in an arrangement which allows a contacting with the first contact terminals E, F, G of the first connector 2 which have a similar arrangement when connecting the connectors in the connecting direction CD.

To provide an electrical connection between the measurement component 5 and the monitoring device 1 it is sufficient that the contact terminals C and F as well as the contact terminals D and G comes into contact with each other, respectively. However, the monitoring device 1 cannot obtain a safe indication thereof whether the measurement component 5 connected is a measurement component which is allowed or capable to operate with the monitoring device 1. Therefore, measures for identification are included in the second connector 4 associated with the measurement component 5.

The second connector 4 comprises two planes perpendicular to the connecting direction CD, a first connecting plane L1 and a second connecting plane L2. While in the first connecting plane L1 only the contact terminals A, C, D are contactable, in the second connecting plane L2 the contact terminals B, C, D are contactable. Contact terminal B is arranged beneath the contact terminal A in the connection direction CD such that contact terminal E contacts either contact terminal A or contact terminal B depending on the progress of the connecting movement. The contact terminals C and D are formed as long shaped contact terminals which extend form the first connecting plane L1 to the second connecting plane L2.

While performing the connecting of the first and the second connectors 2, 4 the first contact terminals E, F, G are coupled with the second contact terminals A, C, D of the second connector 4 such that the contact terminals A and E, C and F and D and G comes into contact when the contact terminals E, F, G of the first connector 2 arrives at the first plane L1. While the connecting progresses, the first connector 2 is further moved relative towards the second connector 4 such that the contact terminals E, F, G of the first connector 2 approaches the second connecting plane L2 and finally contacts the second contact terminals B, C, D provided at the second connecting plane L2.

When the contact terminals E, F, G of the first connector 2 arrives at the contact terminals B, C, D of the second connector 4 the connectors 2, 4 are fully connected. An interconnection between the measurement component and the monitoring device is then provided via the contact terminals C and F, D and G. Furthermore, the monitoring device 1 can identify the kind of measurement component 5 associated with the second connector 4 by detecting the changes of electrical states between signal and supply lines 3 while connecting the first and the second connectors 2, 4 until the final connecting position has been reached. In the present embodiment of FIG. 2 while connecting the contact terminal E firstly comes in contact with the contact terminal A of the second connector 4 and thereafter while further proceeding the connecting process a contact terminal E comes in contact with the contact terminal B of the second connector 4.

In the second connector 4 the contact terminal A and the contact terminal C are interconnected by means of a first resistor R1 and the contact terminal B and the contact terminal C are interconnected with a second resistor R2. Preferably, the resistors have different resistances. Optionally one or more of the resistors can be omitted thereby providing an infinite resistance between the respective contact terminals. The monitoring device 1 is sensing the resistance value between the contact terminals E and F via the respective signal lines 3 while the first connector 2 is being connected to the second connector 4. When the contact terminals E and F comes into contact with the contact terminals A and C, respectively, the monitoring device 1 detects a change of the resistance from an infinite resistance (open circuit between the contact terminals E and F) to the resistance of R1 and while further connecting the connectors 2, 4 to the second connecting stage (arriving the second plane of the second connector) the detected resistance between E and F changes from the resistance value of R1 either directly to the resistance value of R2 or via a change to infinite resistance (open circuit) and thereafter from an infinite resistance to the resistance value of R2. The resistance profile obtained thereby and the predetermined resistance values of R1 and R2 clearly and uniquely identify the second connector 4 and consequently the measurement component 5 connected therewith. As a consequence, the monitoring device 1 may clearly identify what kind of measurement component 5 is attached. In the following the monitoring device 1 can control the measurement component in an appropriate manner and the measurement values measured via the contact terminals F and G can be clearly and uniquely interpreted.

In FIG. 3 a further embodiment of a connector system is depicted. In contrast to the embodiment of FIG. 2 each of the connectors 2 and 4 comprises four contact terminals. The first connector 2 comprises the contact terminals E, J, F, G and the second connector 4 comprises the contact terminals A, B, C, D. The contact terminals B, C, D of the second connector 4 are formed such they extend over the first connecting plane L1 and the second connecting plane L2. The contact terminal A is only contactable via the first connecting plane L1. The first resistance R1 is applied between the contact terminal A and the contact terminal C and the second resistance R2 is connected between the contact terminal B and the contact terminal C. The measurement component 5 is connected with the contact terminals C and D like in the embodiment of FIG. 2. While connecting the contact terminals E, J, F, G firstly come into contact with the respective corresponding contact terminals B, A, C, D, of the first connecting plane L1 of the second connector 4, such that the monitoring device 1 can detect the resistance value of R1 between the contact terminals J and F and the resistance value of R2 between the contact terminals E and F. The monitoring device 1, therefore, experiences a change of the resistance between the contact terminals E and F from infinite resistance to the resistance of R2 and a change between the contact terminals J and F from infinite resistance to the resistance value of R1. While further proceeding the connecting process the contact terminal J comes out of contact to the contact terminal A of the second connector 4 such that the resistance changes from R1 to infinite resistance.

In the monitoring device 1 the resistance changes are monitored and compared to a stored resistance profile indicating resistance changes to identify the measurement component associated with the second connector 4. The stored resistance profile indicates for each allowed second connector 4 a timely change of resistances between specific contact terminals of the first connector 2 and their respective resistance values.

A further embodiment of the connector system is shown in FIG. 4. The connector system of FIG. 4 differs from the connector system as shown in FIG. 2 in that the contact terminal D of the second connector 4 is not present (contactable) in the first connecting plane L1 such that while connecting the first connector 2 and the second connector 4 an applying of the measurement component 5 to the monitoring device 1 is completed only when the connectors 2, 4 are fully coupled, i.e. the contact terminals of the first connector 2 have reached the second connecting plane L2 of the second connector 4. This allows to have a further feature for identifying the respective measurement component 5 in that the monitoring device 1 can determine by sensing the resistance between the contact terminals F and G an infinite resistance in a first connecting plane L1 when the resistance value of R1 is detected between contact terminals E and F and in the second connecting plane L2 the internal resistance of the measurement component 5 can be detected between the contact terminals F and G such that the further feature is provided for identifying the measurement component 5.

Figure 5:
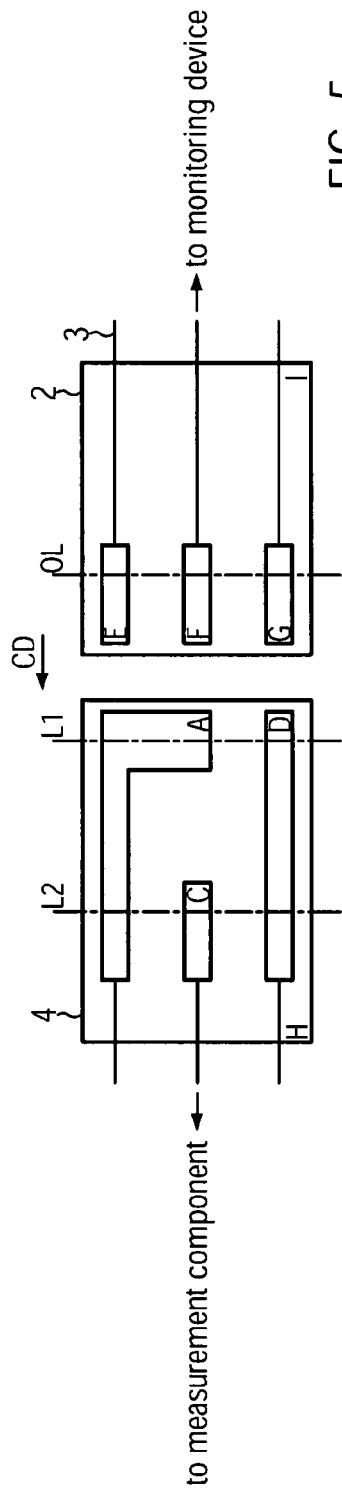
FIG. 5 is a schematic view of an arrangement of contact terminals of first and second connectors of a connector system according to a further embodiment of the present invention.

In FIG. 5 a further embodiment of a connector system is depicted. In contrast to the embodiment of FIG. 2 no resistances have to be provided on the substrate of the first connector 2. The contact terminals A, B are provided as a single contact terminal A which has an L-shape. In the first connecting stage the contact terminals E, F of the first connector 2 both contact the contact terminal A being thereby shortcut which can be detected by the monitoring device 1. While further connecting the two connectors 2, 4 the contact terminal F of the first connector 2 comes out of contact with the contact terminal A of the second connector 4 and comes into contact with contact terminal C of the second connector 4 while the contact terminal E of the first connector 2 remains in contact with the contact terminal A of the second connector 4.

In the monitoring device 1 the resistance changes between contact terminals E, F are detected and compared to a stored resistance profile indicating resistance changes to identify the measurement component associated with the second connector 4. A timely change of an open loop, to a shortcut and back to an open loop between the contact terminals E, F can thereby be interpreted as a full coupling of the two connectors 2, 4.

Figure 6:
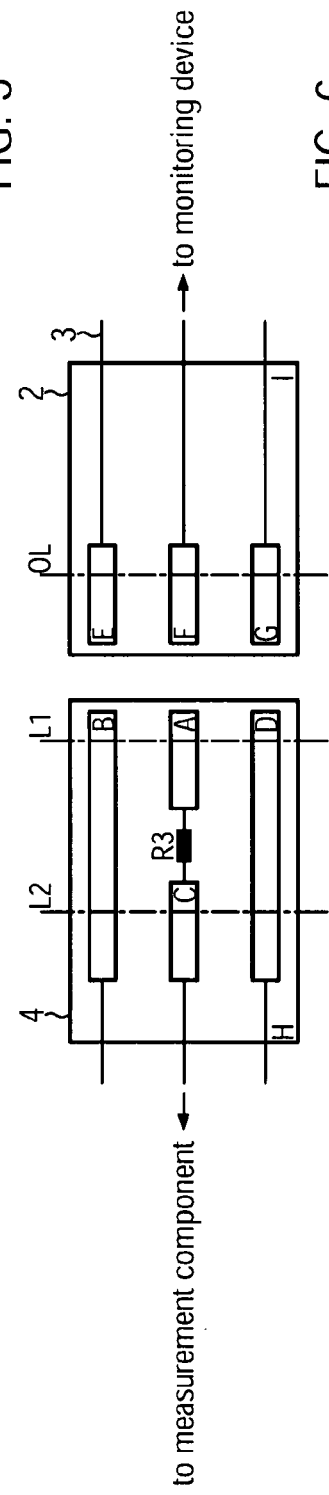
FIG. 6 is a schematic view of an arrangement of contact terminals of first and second connectors of a connector system according to a further embodiment of the present invention.

In FIG. 6 a further embodiment of a connector system is depicted. In contrast to the embodiment of FIG. 2 the contact terminal B of the second connector 4 can be contacted with the contact terminal E of the first connector 2 both in the first and the second connecting stage. Further, the contact terminal C is only contactable by the contact terminal F of the first connector 2 in the second connecting stage and a contact terminal A is provided in the same connecting line before contact terminal C and is adapted to be contacted by the contact terminal F of the first connector 2 in the first connecting stage. Between the contact terminal A and the contact terminal C a resistance R3 is provided. Thereby, the monitoring device 1 detects in the first connecting stage via contact terminal F an electrical quantity which depends on the resistance value R3 and in the second connecting stage an electrical quantity which does not depend on the resistance value R3. In one example a timely change resistance measurement via a contact terminal F does result in a resistance increased by R3 in the first connecting stage and in a resistance not increased by R3 in the following second resistance state.

Figure 7:
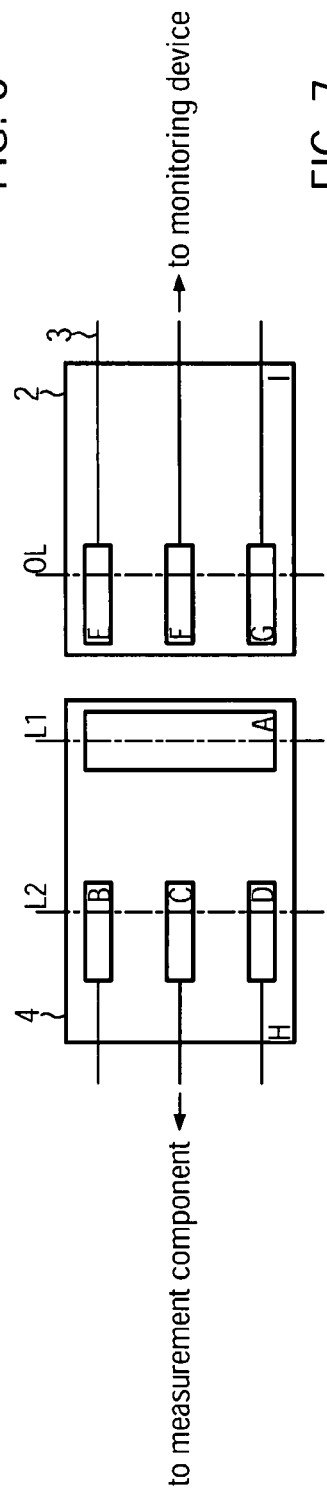
FIG. 7 is a schematic view of an arrangement of contact terminals of first and second connectors of a connector system according to a further embodiment of the present invention.

In FIG. 7 a further embodiment of a connector system is depicted. In contrast to the embodiment of FIG. 2 the contact terminals B, C, D of the second connector 4 can only be contacted with the respective contact terminals E, F, G of the first connector 2 in the second connecting stage. A common contact terminal A is provided which can be contacted by the contact terminals E, F, G substantially at the same time in the first connecting stage thereby providing a shortcut between all contact terminals E, F, G in the first connecting stage. In the second connecting stage the measurement component 5 is directly connected via the first and second connectors 2, 4 to the monitoring device 1 which can detect normal electrical characteristics (e.g. internal impedance) of the measurement component 5 not being influenced by a further electrical element, such as a resistance device or the like.

In the embodiments of FIGS. 2 to 7 it has been intentionally left open how the first and the second connectors 2, 4 are designed. In general, the design of the connectors 2, 4 is substantially arbitrary. It is, however, essential that the first and the second connectors 2, 4 can be coupled with one another and that the connector associated with the measurement component 5 has at least two connecting planes including different arrangements of the plurality of respective contact terminals, wherein the contact terminals related to the different connecting planes are successively contacted while the connecting of the connectors progresses. Some of the second contact terminals are coupled with the measurement component 5 and other contact terminals have a connection with another of the contact terminals via a resistor or another passive electrical device.

In one embodiment, the first contact terminals of the first connector 2 are preferably provided as sliding contacts. The second contact terminals of the second connector 4 are preferably provided as plane contact areas provided on a printed circuit board as a substrate or the like.

Figure 8:
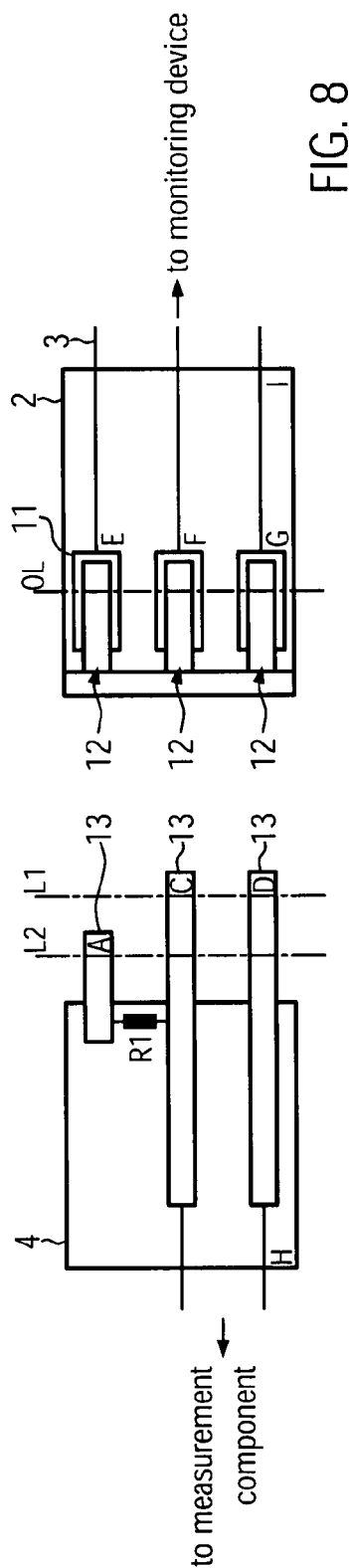
FIG. 8 is a schematic view of a plug and a socket of a connector system according to a further embodiment of the present invention.
Figure 9:
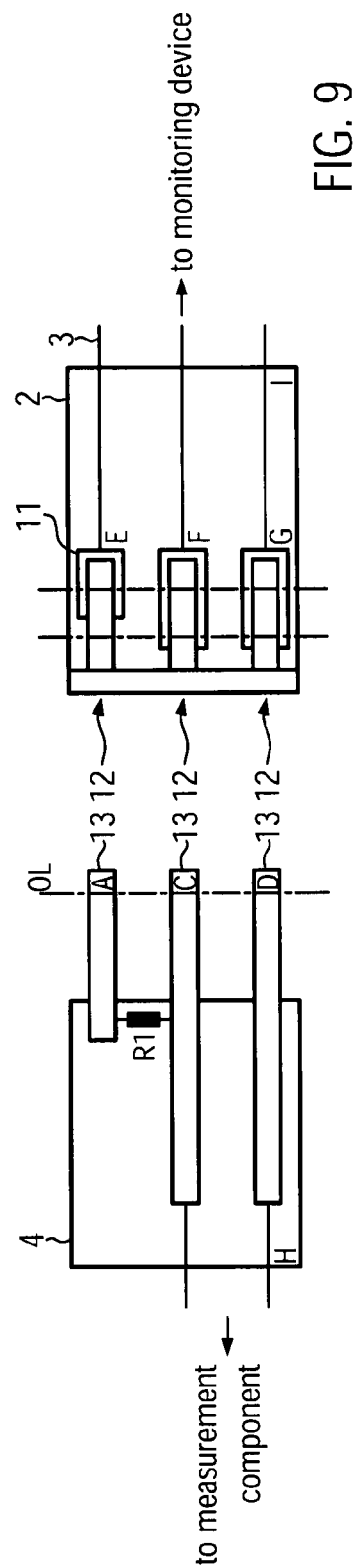
FIG. 9 is a schematic view of a plug and a socket of a connector system according to a further embodiment of the present invention.

The embodiments of FIGS. 8 and 9 now provide that the first connector 2 is configured as a socket and the second connector 4 configured as a plug. The socket of the first connector 2 has openings for receiving pins of the plug of the second connector 4. Inner walls of the openings 12 are provided with inner contact terminals 11 which correspond to the contact terminals E, F, G. The pins of the plug correspond to the second contact terminals A, C, D. The pins 13 have different lengths thereby defining different connecting planes as described above. The pins 13 of the contact terminals C and D have a first, longer length and the pin of the contact terminal A has a second shorter length thereby providing the different connecting planes L1 and L2. While connecting the plug and the socket the pins C and D firstly come into contact with the inner contact terminals 11 F and G of the socket and while further proceeding the connecting the shorter pin A comes into contact with the inner contact terminal E of the socket.

In the monitoring device 1, therefore, it is firstly detected the inner resistance of the measurement component between the contact terminals F and G and while further connecting the plug and the socket the resistance between the contact terminals E and F changes from infinite resistance to the resistance value of R1. Thereby, the measurement component 5 associated with the plug can be clearly and uniquely be identified by determining the resistance profile while connecting the plug and the socket. Identification is defined by the value of the resistance R1 and the length of each of the pins A, C, D of the plug.

Additionally or optionally, as shown in FIG. 9, it can be provided that the socket, as the first connector 2 has openings wherein the inner contact terminals 12 are differently configured thereby providing different connecting planes L3 and L4 with respect to pins of a plug to be connected therewith. While the openings 12 of the contact terminals F and G have an inner contact terminal which can be contacted when the connecting of the pins has reached a first connecting plane L3 of the socket, the contact terminal E is recessed in the respective opening such that the respective pin of the plug can only contact when reached the second connecting plane L4. Thereby, while connecting, a respective pin A of the plug will contact the contact terminal E at a later point of time than the time the pin C and D contact the contact terminals F and G, respectively.

Instead of resistances R1, R2 other kinds of electrical passive devices such as capacities or inductors, or active devices such as transistors and the like can be provided to provide electrically measurable quantities between the respective contact terminals. The electric quantities such as an impedance can e.g. be measured by applying an AC signal via the respective signal lines.

Furthermore, the number of connecting planes in the second connector is not limited to two but can also be more than two. As well the number of electrical devices for providing the electrical quantity is not limited to one or two. Moreover, the inner resistance of the measurement component 5 can be used as one of the resistances to be checked between the respective contact terminals to identify the measurement component.

Figure 10:
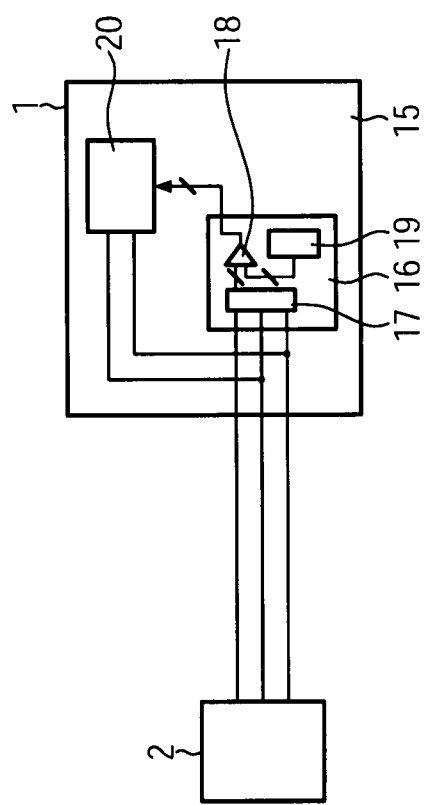
FIG. 10 is a block diagram showing a monitoring device according to a further aspect.

In FIG. 10 a monitoring device 1 is depicted including an identification unit 16 for identifying the kind of measurement component 5 connected with the first connector 2. The identification unit 16 comprises a measurement unit 17 for detecting the resistance values between the different signal lines and for establishing a time-resistance characteristics of the resistances values and its variations in time and comparing such a time-resistance characteristics by means of a comparing unit 18 with profiles prestored in a appropriate memory unit 19. An identification information is output by the comparing unit 18 to a monitoring unit 20 of the monitoring device which is connected to the signal lines 3 reserved for being operatively connected to the measurement component 5. The measurement is performed by the monitoring unit 20 depending on the identification information identifying the respective measurement component 5 connected.

The invention claimed is:

1. A connector system comprising:
a first connector for coupling a monitoring device and having a plurality of first contact terminals;
a second connector (4) for coupling an electrical component and having a plurality of second contact terminals,
wherein between at least two of the plurality of second contact terminals an electrical device is arranged for providing a detectable electrical quantity;

wherein the first and second connectors are capable of being coupled in a connecting process;

wherein the second contact terminals and the electrical device are arranged such that, while connecting, the first contact terminals come into contact with a first subset of the plurality of second contact terminals in a first connecting stage and while the connecting further proceeds the first contact terminals come into contact with a second subset of the second contact terminals, such that in the first connecting stage an electrical quantity between two of the first contact terminals is detectable which is different from the electrical quantity in an uncoupled condition of the connectors, and in the second connecting stage a further electrical quantity between at least two of the first contact terminals, is detectable which is different from the electrical quantity detected in the first connecting stage.

2. The connector system of claim 1, wherein the electrical device is at least one of a resistor, a capacity and an inductivity.

3. The connector system of claim 1, wherein the second connector is configured to provide two second contact terminals wherein one of the two second contact terminals being contactable by a respective one of the first contact terminals in the first connecting stage and the other of the two second contact terminals is contactable by the respective one first contact terminal in the second connecting stage.

4. The connector system of claim 3, wherein the two second contact terminals are each coupled with one electrical device and are spaced such that, while connecting, the one first contact terminal is isolated from the two second contact terminals between the first and the second connecting stages.

5. An electrical component arrangement comprising:
an electrical component;
a connector (4) coupled with the electrical component;
wherein the connector (4) having a plurality of second contact terminals,
wherein between at least two of the plurality of contact terminals an electrical device is arranged for providing a detectable electrical quantity;
wherein a first subset of the plurality of contact terminals is arranged to be contactable in a first connecting plane and a second subset of the contact terminals is arranged to be contactable in a second connecting plane, such that, when contacting the first subset of the contact terminals in the first connecting plane an electrical quantity between two of the contact terminals is detectable, and when contacting the second subset of the contact terminals in the second connecting plane a further electrical quantity between two of the contact terminals is detectable which is different from the electrical quantity detected between the respective two of the contact terminals in the first connecting plane.

6. The electrical component arrangement of claim 5 wherein one of the electrical quantities detectable in the first connecting plane and/or the second connecting plane is provided by the electrical component.

* * * * *

UNITED STATES PATENT AND TRADEMARK OFFICE
CERTIFICATE OF CORRECTION

PATENT NO. : 8,597,048 B2  Page 1 of 1
APPLICATION NO. : 12/599473
DATED : December 3, 2013
INVENTOR(S) : Ulrich Pfeiffer et al.

It is certified that error appears in the above-identified patent and that said Letters Patent is hereby corrected as shown below:

Title page, item (22) should read as follows: PCT Filed:   May 5̶6, 2008

Signed and Sealed this
Fifteenth Day of April, 2014

Michelle K. Lee
*Deputy Director of the United States Patent and Trademark Office*